United States Patent [19]

Korenivski et al.

[11] Patent Number: 5,744,972
[45] Date of Patent: Apr. 28, 1998

[54] DEVICE AND METHOD TO MEASURE THE COMPLEX PERMEABILITY OF THIN FILMS AT ULTRA-HIGH FREQUENCIES

[75] Inventors: Vladislav Korenivski, Westfield; Zhengxiang Ma, New Providence; Paul Matthew Mankiewich, Glen Gardner; Paul Anthony Polakos, Marlboro; Robert Bruce van Dover, Maplewood, all of N.J.

[73] Assignee: Lucent Technologies Inc., Murray Hill, N.J.

[21] Appl. No.: 627,638

[22] Filed: Apr. 5, 1996

[51] Int. Cl.$^6$ .................................................. G01N 27/72
[52] U.S. Cl. .......................... 324/649; 324/654; 324/717; 324/229
[58] Field of Search ............................ 324/649, 654, 324/693, 713, 717, 707–708, 236, 234, 229, 228, 222, 95; 336/225–232

[56] References Cited

U.S. PATENT DOCUMENTS

| | | | |
|---|---|---|---|
| 2,693,574 | 11/1954 | Koppelmann | 324/222 |
| 3,226,615 | 12/1965 | Nagel | 324/690 X |
| 3,234,461 | 2/1966 | Trent et al. | 324/234 X |
| 5,091,696 | 2/1992 | Koosen | 324/229 |
| 5,528,142 | 6/1996 | Feickert | 324/236 |
| 5,559,436 | 9/1996 | Matthews et al. | 324/236 |
| 5,583,426 | 12/1996 | Tiefnig | 324/228 X |

*Primary Examiner*—Ernest Karlsen
*Assistant Examiner*—Diep Do

[57] ABSTRACT

The device has a single strip having a first end, a second end, a length and a width. The first end of the strip is curved toward the second end of the strip to form a loop having a height. The length is approximately 10 mm, the width is approximately 5–8 mm, and the height is approximately 0.8–1.2 mm. The loop is preferably fabricated from copper. The loop is mounted directly to a test instrument such as a computer controlled impedance analyzer or network analyzer. The test instrument measures the inductance and resistance of the loop with no thin film sample placed therein, and then measures the inductance and resistance of the loop containing the sample under test. From these measurements, the device ultimately derives the permeability of the sample under test. The method for measuring the complex permeability of thin films at ultra-high frequencies includes the steps of recording the residual inductance and resistance for the loop empty; measuring the total inductance and resistance for the loop loaded with the sample under test; determining the change in resistance by subtracting the resistance of the loop without any sample from the resistance when the loop is loaded with the sample under test; determining the change in inductance by subtracting the inductance of the loop without any sample from the inductance when the loop is loaded with the sample under test; and calculating permeability.

28 Claims, 4 Drawing Sheets

DEVICE AND METHOD TO MEASURE THE COMPLEX PERMEABILITY OF THIN FILMS AT ULTRA-HIGH FREQUENCIES

FIELD OF THE INVENTION

This invention relates to the field of thin films, and more particularly to a device and method of measuring the properties of thin films at ultra-high frequencies.

BACKGROUND OF THE INVENTION

Over the years, an increasing need to develop thin magnetic films for high frequency applications has emerged. In the development of recording heads, for example, permalloy and amorphous films are utilized in magnetic data storage systems, and magnetic oxide films for planar components in rf and microwave components. In order to design such devices using thin magnetic films, it is necessary to determine the permeability of the films over the operating bandwidth.

Several approaches have been used to measure the high frequency permeability of films as a function of frequency. These approaches can be divided into two main groups: (1) systems employing the transformer method, and (2) systems using Transverse Electromagnetic Field (TEM) transmission line devices. In the systems employing the transformer method, two coils are utilized; the drive coil, and the pick-up coil. In these systems, an ac field is excited by the drive coil and the signal detected by the pick-up coil which is traditionally positioned inside the larger drive coil.

Although transformer methods provide reliable and accurate measurements of thin film permeability, a fundamental problem exists at high frequencies. Namely, the system exhibits coupling from one coil to another which, in turn causes internal resonances. In addition, due to their relatively big size and complex structure, the frequency range of these devices is limited to below about 0.1 GHz. Thus, present day transformer methods fail when measuring the characteristics of thin films at ultra-high frequencies.

Transmission line methods, on the other hand, are broadband methods, and thus are particularly suitable for microwave frequencies. Because of the nature of TEM mode propagation (which requires that the sample under test homogeneously fills the plane perpendicular to the direction of propagation), however, these methods are, strictly speaking, applicable only to bulk samples (often of toroidal shape). Moreover, since application of transmission line methods to film samples is not straightforward and requires extensive mathematical analysis, such methods are even less desirable for measuring the permeability of thin films in the 0.01–2 GHz frequency range.

SUMMARY OF THE INVENTION

Accordingly, the present invention provides a device and method for measuring the permeability of thin films in the 0.01–2 GHz frequency range without the need for the complex data computations and the burdens associated with the prior art. To attain this, a single, small coil is substituted for the two large coils used in traditional transformer methods. The single, small coil eliminates the problems of resonance and size found in the transformer methods of the prior art. In addition, the method and device of the present invention eliminate the need for the extensive mathematical analysis used in prior art TEM transmission line devices.

In accordance with the present invention, there is provided a device having a single strip curved to form a loop having a length approximately 10 mm, a width approximately 5–8 mm, and a height approximately 0.8–1.2 mm. The loop is preferably fabricated from copper. The loop is mounted directly on a test instrument such as a computer controlled impedance analyzer or network analyzer which measures the inductance and resistance of the loop containing the sample under test and ultimately derives the permeability of the sample under test.

The present invention also includes a method for measuring the complex permeability of thin films at ultra-high frequencies which includes the steps of recording the residual inductance and resistance for the loop, when empty; measuring the total inductance and resistance for the loop, when loaded with the sample under test; determining the change in resistance by subtracting the resistance of the loop without any sample from the resistance when the loop is loaded with the sample under test; determining the change in inductance by subtracting the inductance of the loop without any sample from the inductance when the loop is loaded with the sample under test; and calculating permeability.

BRIEF DESCRIPTION OF THE DRAWINGS

A more complete understanding of the present invention may be obtained from consideration of the following description in conjunction with the drawings in which.

DETAILED DESCRIPTION OF VARIOUS ILLUSTRATIVE EMBODIMENTS

Figure 1:
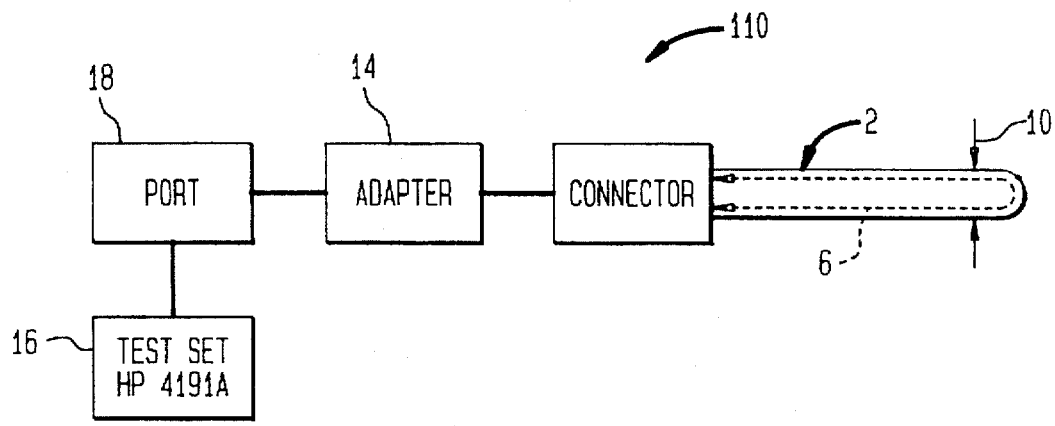
FIG. 1 is a schematic of a measuring system embodying the present invention for frequencies ($f$)<1 GHz.

Turning now to the drawings, FIG. 1 shows a schematic of the measuring system for $f$<1 GHz. The device of the present invention is a single strip 2 having two ends. One end is curved toward the second end to form a loop 4. The strip 2 has a length 6, width 8, and the loop 4 formed has a height 10. The length 6 is about 10 mm, the width 8 is about 5 to 8 mm, and the height 10 is about 0.8 to 1.2 mm.

The strip 2 can be made from any good conductive material such as silver, gold, platinum, or copper. The strip 2 is preferably fabricated from copper since this material has a high conductivity. The strip 2 can also be made from any nonmetal such as plastic having a metal coating or plating on one or all sides of the strip 2. The loop 4 has a geometric shape that is rectangular in plan view but can be shaped arbitrarily to fit any size and shape of film.

In the preferred embodiment, the loop 4 is connected directly to the test instrument. Using a computer-controlled impedance analyzer such as an HP4191A to measure the inductance and resistance of the sample under test, the loop 4 would be connected to the port 18 labeled the unknown port. Typically, a HP4191A, 1–1000 MHz is used for measuring frequencies of 1 GHz or less while a Wiltron W37217A network analyzer is used for measuring frequencies between the 1 GHz and 2 GHz range.

In another embodiment, a fixture 110 consists of the device of the present invention mounted directly on a connector 12 using solder, silver paste, silver paint, or silver epoxy or other ways such as conductive adhesive to adhere the strip 2 to the connector 12. The connector 12 can be a standard connector such as a right-angle SMA connector coupled to a standard adapter 14 such as an APC-7 adapter.

Using the impedance analyzer as an example, the fixture 110 is then connected to the impedance analyzer test set 16 via the port 18 labeled the unknown port on the HP4191A. A computer-controlled impedance analyzer or network analyzer is used to measure the inductance and resistance of the fixture 110 containing the sample under test. Optionally, a Helmholtz coil is used to apply an external dc magnetic field. The fixture 110 is extremely simple and takes only minutes to set up. In contrast to the traditional transformer techniques, here the loop 4 of the device is used both to excite ac field and to detect the sample's response.

Figure 2:
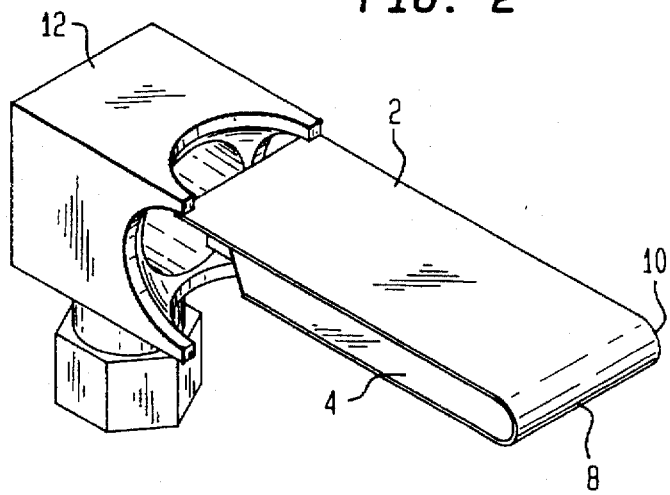
FIG. 2 is a perspective view of the device embodying the present invention.
Figure 3:
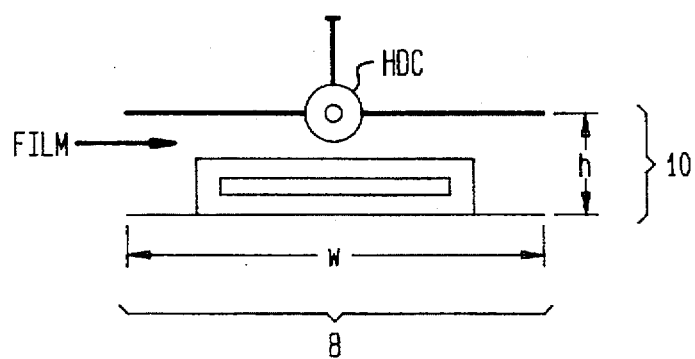
FIG. 3 is a side view of the device of the present invention loaded with the sample under test.

Referring now to FIG. 2, there is shown a perspective view of the device embodying the present invention. As shown, strip 2 forms a loop 4 in that one end of strip 2 is curved toward the second and mounted to the connector 12. A side view of the present inventive device having a loop 4 with a height 10 and a width 8 is shown in FIG. 3. The magnetic field (H) in the center of a loop 4 carrying current I is $$H = k_H \frac{I}{w}, \quad (1)$$

where $k_H \leq 1$ is a geometrical factor, w is the width, and I is the current. For an infinitely long loop 4 of width w and height h, $k_H=(2/\pi)\tan^{-1}(w/h)$. The actual magnetic field in the loop was measured using a test pick-up coil and a lock-in amplifier, and $k_H$ was found to be $k_H=0.90–0.94$. The magnetic field homogeneity across a 4 mm wide sample centered in a device of the present invention having a width of 6 mm was measured to be ~6%.

The principle of the method can be understood using the following considerations. The flux ($\Phi$) due to a magnetic film enclosed by a strip loop of the device of the present invention is $$\Phi = \mu_0 \chi \cdot H \cdot \frac{V}{w} \cdot \Psi, \quad (2)$$

where $\mu_0 = 4\pi \times 10^{-7}$ H/m is the permeability of free space, $\chi$ is the susceptibility of the film, H is the magnetic field, V is the volume of the film, w is the width of the loop and $\Psi \leq 1$ is a geometrical correction term, which, in general, is a function of the film-coil geometry. The value of $\Psi$ was typically in the range of 0.8–0.9 and does not vary appreciably (within ~3%) with the size of the film. Using (1) and (2) with exponential time dependence for the current, $I = I_0 \cdot \exp(-j\omega t)$ where $\omega$ is the angular frequency, t is the time and $I_0$ is the amplitude of the current, then the following formula is the impedance, Z, induced by the flux $\Phi$:

$$Z = \frac{V_\Phi}{I} = -\frac{\dot\Phi}{I} = j\omega \frac{V}{w^2} k_H \Psi \mu_0 \chi, \quad (3)$$

where $V_\Phi$ is the voltage induced by the flux $\Phi$ and the dot above $\Phi$ means derivative with respect to time. Noting that $\chi = \chi' - j\chi''$, the inductance and resistance are $$L = k \cdot \mu_0 \chi' \cdot t = k \cdot \mu' \cdot t = k \cdot \Lambda'$$

$$R/\omega = k \cdot \mu_0 \chi'' \cdot t = k \cdot \mu'' \cdot t = k \cdot \Lambda'' \quad (4)$$

Here $k = k_H \cdot \Psi \cdot S_F / w^2$ is a geometrical factor of the order of unity, $S_F$ is the in-plane area of the film, t is the thickness of the film, $\Lambda$ is permeance, the product of the permeability and thickness of the film, wherein the relation $\mu = \mu_0 \mu_r = \mu_0 (1+\chi)$ is used. The approximate equality in (4) refers to the fact that for magnetic films used in practice $\chi' \gg 1$. Thus, the change in inductance and resistance of the loop 4 of the device, when the sample is inserted, is proportional to the real and imaginary permeance, respectively, of the film under test. Although we find the above description to be accurate to within ~10%, calibration with a standard sample is desirable for each particular loop geometry.

One embodiment of the inventive method includes the steps of: (1) After correction for the electrical length of the fixture 110, the total impedance of the fixture 110, when empty, is the sum of the residual impedance of the APC-7 adapter 14 and the SMA-loop terminal, wherein the latter includes the flux-induced impedance of the empty measuring loop 4; (2) By recording the residual inductance and resistance of the empty fixture 110 and subtracting it from the data for the fixture 110 loaded with the sample, changes in serial inductance and resistance, L and R (which actually are $\Delta L = L - L_{empty}$ and $\Delta R = R - R_{empty}$) defined in the previous section are obtained; (3) $L_{empty}$ and $R_{empty}$ are once measured for the empty fixture, stored in the computer and automatically subtracted from subsequent measurements of L and R for the fixture loaded with the sample under test; and (4) a conversion of L and R to permeance (permeability, or susceptibility) is made. Note that other embodiments of the invention can be achieved by directly adhering loop 4 or any other type of fixture to the test instrument.

Figure 4:
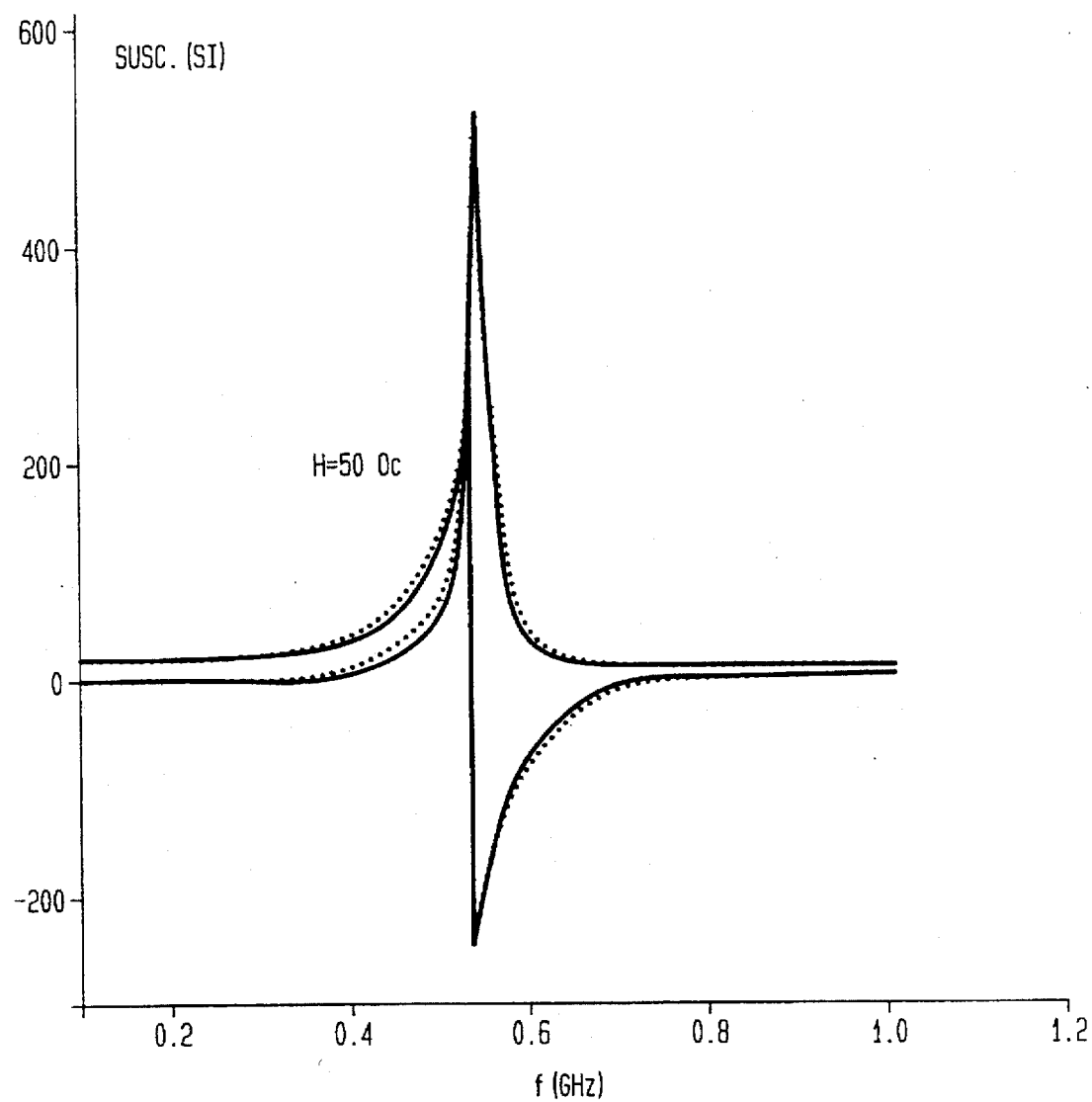
FIG. 4 graphically illustrates the complex magnetic susceptibility of a substituted yttrium-iron-garnet (YIG) film of thickness (t)=1.46 μm and $4\pi M_s$=895 G vs. frequency at a dc magnetic field strength ($H_{dc}$)=50 Oe.

Referring to FIG. 4, YIG is a good model system for high frequency magnetic measurements, because it has practically no internal anisotropy (only shape anisotropy), narrow ferromagnetic resonance (FMR) line-widths, and no effects of eddy currents in thin films. Shown in FIG. 4 is the measured complex susceptibility as denoted by the solid line of a substituted YIG film as a function of frequency for magnetic field, $H_{dc} = 50$ Oe applied in-plane perpendicular to the ac field. The value of $\chi'$ extrapolated to zero frequency is set to be equal to the low-frequency, typically 200 Hz, susceptibility measured with a standard transverse susceptibility setup, which is also equal to $\chi' = 4\pi M_S / H_{dc} = 895/50 \approx 1$ (no in-plane anisotropy). The low-frequency $\chi'$ value obtained from the measured L and R using (4) is ~90% of the true susceptibility value, which gives the calibration. The curves are a typical example of a FMR susceptibility. The dotted lines in FIG. 4 is the theoretical susceptibility obtained from the equation of motion of the magnetization vector with damping term of Landau-Lifshitz type and shape anisotropy taken into account, and for the saturation magnetization of $4\pi M_S = 895$ G. The Lande g factor and the damping coefficient were adjusted to give the experimentally measured resonance frequency and line-width, respectively. The agreement is good, which means that the measured line shapes are quite reasonable. The resonance frequency was also confirmed to scale with the square root of $H_{dc}$, $f_R \sim H_{dc}^{1/2}$ (for $H_{dc} \ll 4\pi M_S$). Apart from a scaling coefficient there is no data processing. In fact, for the data shown in FIG. 4 the scaling coefficient is 1.0 and the scale for $\chi'$ is also the scale for L in pH.

Figure 5:
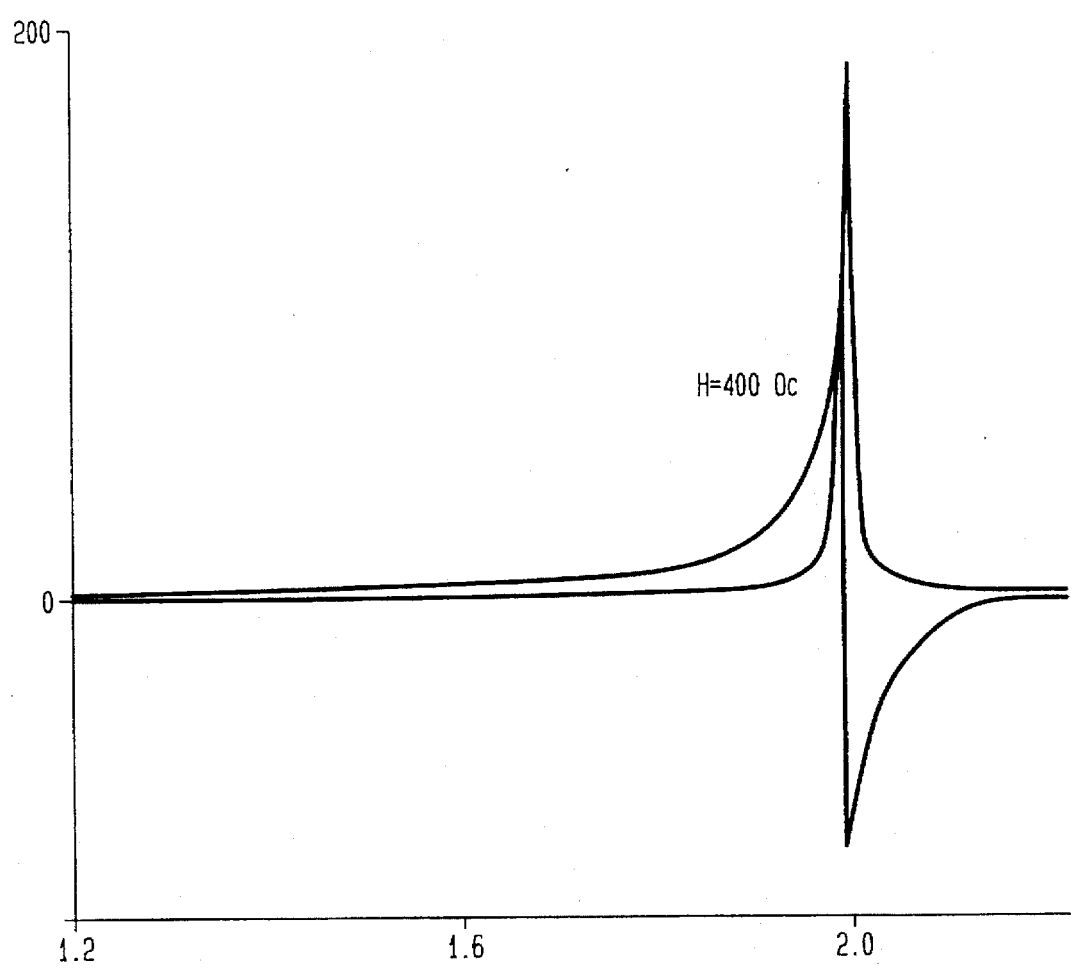
FIG. 5 graphically illustrates the complex magnetic susceptibility of a substituted YIG film of t=1.46 μm and $4\pi M_s$=895 G vs. frequency at $H_{dc}$=400 Oe.

Referring to FIG. 5, there is shown a similar type measurement for $H_{dc} = 400$ Oe. FIG. 5 shows the susceptibility of the YIG film at $H_{dc} = 400$ Oe obtained from a reflection measurement with a network analyzer for a 5 mm long loop. The FMR data at ~2 GHz are quite reasonable.

Figure 6:
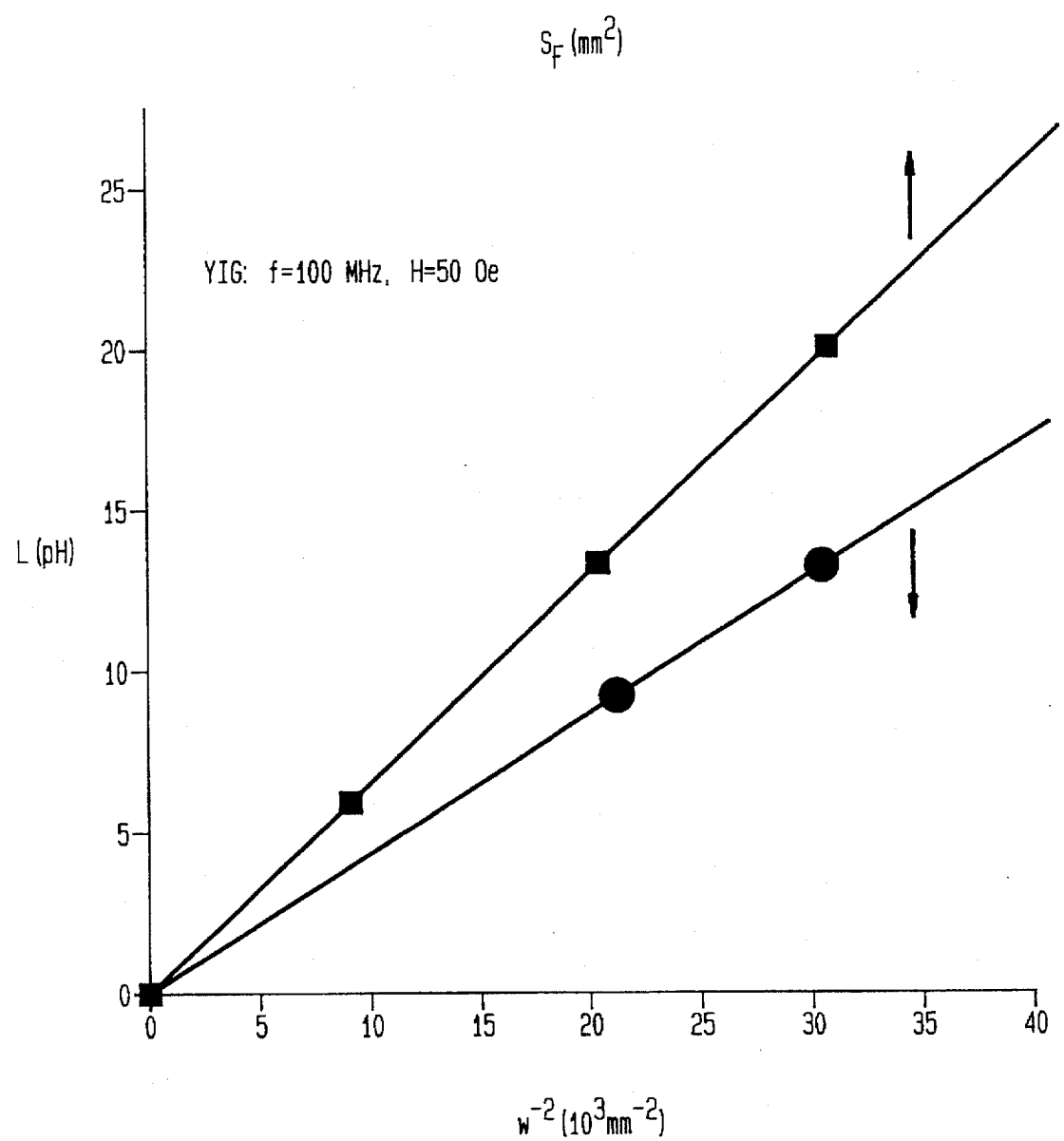
FIG. 6 is a graph of inductance (L) at 100 MHz and $H_{dc}$=50 Oe for a substituted YIG film as a function of in-plane area of the film ($S_F$) and inverse square of the width of the measuring loop (w).

Turning now to FIG. 6, it is shown that the inductance L is proportional to the in-plane area of the film ($S_F$), and inversely proportional to the square of the width 8 of the loop 4, which justifies the above description and also means that there is no 'parasitic' film-loop coupling effects in the system.

The resolution in the measuring system is limited by the resolution in the impedance measurement of the impedance analyzer. For the HP4191A the resolution is ~1 m$\Omega$ ($10^{-4}$ resolution in the reflection coefficient), which means ~1 μm resolution in permeance at 0.1 GHz and ~0.1 μm at 1 GHz. Although negligible in most cases, for low permeability films the substrate background has to be subtracted, which can amount to a few pH in L for substrates like gadolinium-gallium-garnet (GGG). The method described is accurate as long as the measuring loop 4 can be considered a lumped element, i.e., the length 6 of the loop 4 should be less than ~1/30 of the free-space wavelength at the highest frequency of measurement. The length 6 of the loop 4 should not exceed about 1/10 of the free-space wavelength at the highest frequency of measurement. For 1 GHz this means that the total length 6 of the loop 4 should not exceed ~1 cm, or the sample length is no more than ~4 mm. A twice shorter loop allows accurate measurements up to 2 GHz on samples not exceeding 2 mm in length.

Numerous modifications and alternative embodiments of the invention will be apparent to those skilled in the art in view of the foregoing description. For example, after minor modifications of the fixture 110, the same measurement system can be done in transmission utilizing the four-port capabilities of the network analyzer. Accordingly, this description is construed as illustrative only and is for the purpose of teaching those skilled in the art the best mode of carrying out the invention. Details of the structure may be varied substantially without departing from the spirit of the invention and the exclusive use of all modifications which come within the scope of the appended claims is reserved.

What is claimed:

1. A method for measuring the complex permeability of thin films at ultra-high frequencies comprising the steps of:
   providing a conductive strip having a first end and an opposite second end, said conductive strip being formed into a loop by turning said first end toward said second end;
   measuring a first inductance and a first resistance for the loop at one or more of said ultra-high frequencies when empty;
   loading the loop with a sample thin film to form a loaded loop;
   measuring a second inductance and a second resistance of the loaded loop at said one or more of said ultra-high frequencies;
   determining a resistance change by subtracting said first resistance from said second resistance;
   determining an inductance change by subtracting said first inductance from said second inductance; and
   calculating the permeability of the thin film from said resistance change and said inductance change.

2. The method of claim 1 further including the step of connecting the loop directly to a predetermined test instrument capable of measuring inductance and resistance.

3. The method of claim 2 wherein said test instrument includes a computer controlled impedance analyzer and a network analyzer.

4. A system for measuring the complex permeability of thin films at ultra-high frequencies, comprising
   a solid strip having a first end, a second end, a length, and a width, said first end of said strip being substantially curved toward said second end of said strip to form an elongated loop, wherein said loop is adapted to couple with a sample of one of said thin films to be measured to provide a load to said loop;
   a test instrument capable of measuring inductance and resistance; and
   a connector for connecting said loop to said test instrument, wherein said test instrument measures inductance and resistance in said loop, said permeability of said sample being determined by comparison of measurements of said inductance and resistance in said loop with and without said load.

5. The system according to claim 4 wherein said length of said strip between said first end and said second end is approximately 10 mm.

6. The system according to claim 4 wherein said width of said strip is at least 5 mm.

7. The system according to claim 4 wherein said width of said strip is less than or equal to 8 mm.

8. The system according to claim 4 wherein said loop defines a space having a height of at least 0.8 mm.

9. The system according to claim 4 wherein said loop defines a space having a height that is at most 1.2 mm.

10. The system according to claim 4 wherein said strip is fabricated of copper.

11. The system according to claim 4 wherein said loop of said strip is rectangular in shape in plan view.

12. The system according to claim 4 wherein said loop of said strip has an arbitrary shape in plan view.

13. The system according to claim 4 wherein said length of said strip is less than 1/30 of the free-space wavelength at the highest frequency of measurement.

14. The system according to claim 4 wherein said length of said strip is no greater than 1/10 of the free-space wavelength at the highest frequency of measurement.

15. The system according to claim 4 wherein said strip is fabricated from the group consisting of silver, gold, platinum, and copper.

16. The system according to claim 4 wherein said strip is metallic.

17. The system according to claim 4 wherein said strip is a nonmetal and wherein said first end of said strip has a metallic plating.

18. The system according to claim 4 wherein said connector is soldered to said loop.

19. The system according to claim 4 wherein said connector is affixed to said loop by silver epoxy.

20. A device for measuring the complex permeability of thin films at ultra-high frequencies using a test instrument comprising
   a strip having a first end, a second end, a length that is approximately 10 mm, and a width is between 5 mm and 8 mm, wherein said first end of said strip is substantially curved toward said second end of said strip to form a loop, said loop defining a space having a height of at least 0.8 mm; and
   a connector for connecting said first end and said second end of said loop to said test instrument, said strip adapted to be loaded with a sample of one of said thin films to be measured, wherein said permeability is determined by inductance and resistance measurements of said loop by said test instrument at said ultra-high frequencies.

21. A device as in claim 20 wherein said strip is fabricated from the group consisting of silver, gold, platinum, and copper.

22. A device as in claim 20 wherein said loop of said strip is rectangular in shape in plan view.

23. A device as in claim 20 wherein said length of said strip is less than 1/30 of the free-space wavelength at the highest frequency of measurement.

24. A device as in claim 20 wherein said length of said strip is no greater than 1/10 of the free-space wavelength at the highest frequency of measurement.

25. The method of claim 1, wherein said ultra-high frequencies include a range between 0.01–2 GHz.

26. The method of claim 1, wherein said permeability is calculated according to the following relationships:

$$L \equiv k\Lambda', R/\omega \equiv k\Lambda'',$$

where $$k = k_H \psi S_F / W^2,$$

where $k_H$ is a geometrical factor $\leq 1$, $S_F$ is the in-plane area of the film, w is the width and $\psi$ is a geometrical correction term.

27. The system of claim 4, wherein said permeability is calculated according to the following relationships:

$$L \equiv k\Lambda', R/\omega \equiv k\Lambda'',$$

where $$k = k_H \psi S_F / W^2,$$

where $k_H$ is a geometrical factor $\leq 1$, $S_F$ is the in-plane area of the film, w is the width and $\psi$ is a geometrical correction term.

28. The device of claim 20, wherein said loop is elongated and said sample and said loop couple in substantially parallel planes.

* * * * *